United States Patent
Sakaguchi

(10) Patent No.: US 9,646,924 B2
(45) Date of Patent: May 9, 2017

(54) INTERPOSER, METHOD FOR MANUFACTURING INTERPOSER, AND SEMICONDUCTOR DEVICE

(71) Applicant: SHINKO ELECTRIC INDUSTRIES CO., LTD., Nagano-shi, Nagano (JP)

(72) Inventor: Hideaki Sakaguchi, Nagano (JP)

(73) Assignee: SHINKO ELECTRIC INDUSTRIES CO., LTD., Nagano-shi, Nagano (JP)

( * ) Notice: Subject to any disclaimer, the term of this patent is extended or adjusted under 35 U.S.C. 154(b) by 112 days.

(21) Appl. No.: 14/311,416

(22) Filed: Jun. 23, 2014

(65) Prior Publication Data

US 2014/0376189 A1    Dec. 25, 2014

(30) Foreign Application Priority Data

Jun. 24, 2013  (JP) .................. 2013-131816

(51) Int. Cl.
| | | |
|---|---|---|
| H05K 1/02 | (2006.01) | |
| H05K 1/18 | (2006.01) | |
| H01L 23/498 | (2006.01) | |
| H01L 23/473 | (2006.01) | |

(52) U.S. Cl.
CPC ...... *H01L 23/49827* (2013.01); *H01L 23/473* (2013.01); *H01L 23/49816* (2013.01); *H01L 23/49894* (2013.01); *H01L 2224/16225* (2013.01); *H01L 2224/32225* (2013.01); *H01L 2224/73204* (2013.01); *H01L 2924/15311* (2013.01)

(58) Field of Classification Search
CPC ........... H01L 23/473; H01L 2924/0002; H01L 2924/00; H01L 21/563; H01L 2224/73203; H01L 2924/01079; H01L 2924/09701; H01L 2924/16225; H01L 2924/32225; H01L 2924/01019; H01L 2224/73204; H01L 23/49827; H01L 2224/16225; H01L 2924/15311; H01L 2224/32225; H01L 23/49894; H01L 23/49816; H05K 1/0272
USPC ................. 361/699, 719; 257/E23.098, 778; 174/252
See application file for complete search history.

(56) References Cited

U.S. PATENT DOCUMENTS

| | | | |
|---|---|---|---|
| 4,859,520 A | | 8/1989 | Dubuisson et al. |
| 5,870,823 A | * | 2/1999 | Bezama ............... H01L 23/473 165/80.4 |
| 8,860,212 B1 | * | 10/2014 | Foong .................. H01L 23/473 257/714 |
| 2001/0026439 A1 | | 10/2001 | Geusic et al. |
| 2008/0150162 A1 | * | 6/2008 | Koizumi .............. H01L 21/563 257/778 |

(Continued)

FOREIGN PATENT DOCUMENTS

| | | |
|---|---|---|
| JP | 4859520 | 8/1986 |
| JP | 2008-159619 A | 7/2008 |

*Primary Examiner* — Stephen Sul
(74) *Attorney, Agent, or Firm* — Drinker Biddle & Reath LLP

(57) ABSTRACT

Electrodes pads formed on device surfaces connect semiconductor chips to through electrodes of an intermediate substrate. A flow path is formed inside the intermediate substrate. A cooling medium flows through the flow path. Stoppers are attached to an inner surface of the flow path. The stoppers include metal abutment members, respectively. An end of each pipe abuts against the counterpart abutment member. Solder connects the pipes to the abutment members.

12 Claims, 15 Drawing Sheets

(56) References Cited

U.S. PATENT DOCUMENTS

| | | | |
|---|---|---|---|
| 2010/0171213 A1* | 7/2010 | Hisano | H01L 23/3128 257/714 |
| 2012/0103575 A1* | 5/2012 | Tang | H01L 23/473 165/104.31 |
| 2012/0235305 A1* | 9/2012 | Kim | H01L 23/3135 257/774 |
| 2013/0228914 A1* | 9/2013 | Di Stefano | F28F 3/00 257/712 |

* cited by examiner

INTERPOSER, METHOD FOR MANUFACTURING INTERPOSER, AND SEMICONDUCTOR DEVICE

CROSS-REFERENCE TO RELATED APPLICATION(S)

This application claims priority from Japanese Patent Application No. 2013-131816, filed on Jun. 24, 2013, the entire contents of which are herein incorporated by reference.

BACKGROUND

1. Technical Field

Exemplary embodiments of the invention relate to an interposer, a method for manufacturing an interposer, and a semiconductor device.

2. Related Art

A semiconductor chip generates heat due to its operation. Heat in a semiconductor chip causes an operational abnormality or deterioration of the semiconductor chip. Therefore, a semiconductor chip is joined to a substrate including a flow path, and refrigerant is passed through the flow path of the substrate to cool the semiconductor chip (for example, see US 2008/0150162 A).

SUMMARY

By the way, pipes for circulating refrigerant are connected to a substrate including a flow path, with an adhesive agent such as a resin. The refrigerant is, for example, water. Cracks may be formed in the adhesive agent such as the resin, depending on a usage environment (temperatures) or due to aging, and there is a possibility that the refrigerant may leak through the cracks to the outside. Such leak of the refrigerant causes failure of the semiconductor chip mounted on the substrate.

Exemplary embodiments of the invention prevent leakage of refrigerant.

According to one exemplary embodiment, an interposer for cooling an electronic component includes a substrate body, a first member, and a second member. The substrate body is configured to be mounted with the electronic component. The substrate body is formed with a flow path, an inflow port, and an outflow port. The flow path is formed inside the substrate body. A cooling medium flows through the flow path. The cooling medium flows into the flow path through the inflow port. The cooling medium flows out of the flow path through the outflow port. The first member is formed on an inner surface of the flow path. The first member includes a first abutment member and a first connection member. The first abutment member defines a first opening. The first opening is smaller in section area than the inflow port. The first connection member connects the first abutment member to the inner surface of the flow path. The first connection member defines a second opening. A section area of the second opening is substantially equal to that of the inflow port. The second member is formed on the inner surface of the flow path. The second member includes a second abutment member and a second connection member. The second abutment member defines a third opening. The third opening is smaller in section area than the outflow port. The second connection member connects the second abutment member to the inner surface of the flow path. The second connection member defines a fourth opening. A section area of the fourth opening is substantially equal to that of the outflow port.

With this configuration, it is possible to prevent leakage of refrigerant.

DETAILED DESCRIPTION

Hereinafter, exemplary embodiments will be described with reference to the accompanying drawings.

In the accompanying drawings, some portions may be illustrated in an enlarged manner, and their dimensions, size ratio therebetween, the number of them, and the like may be different from actual ones. Also, in section views, hatching may be partly omitted in order to facilitate understanding of the section structures of components.

Figure 1:
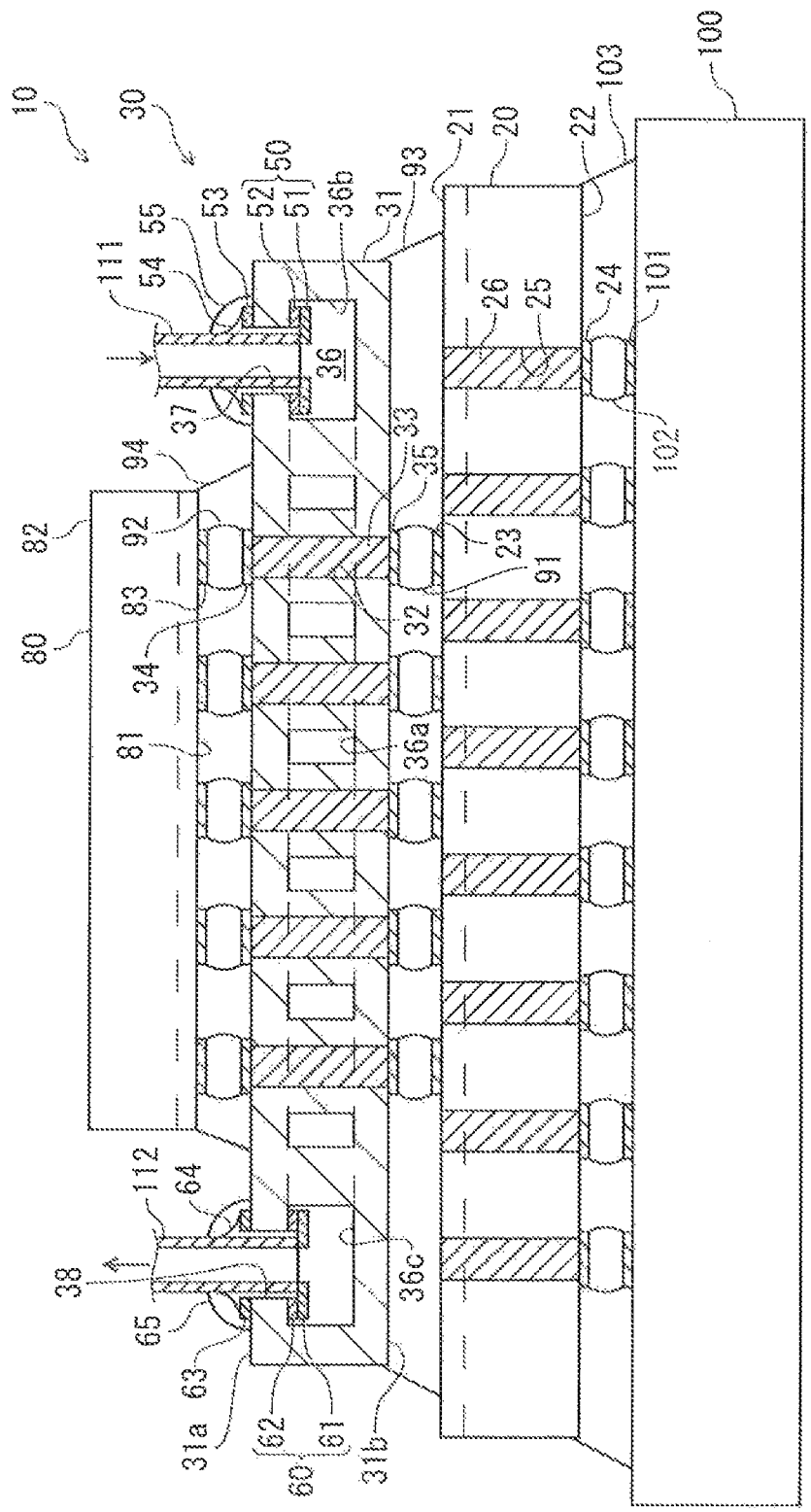
FIG. 1 is a schematic diagram of a semiconductor device.

As shown in FIG. 1, a semiconductor device 10 is mounted on an upper surface of a wiring substrate 100. For example, the wiring substrate 100 is a motherboard.

A plurality of electrode pads 101 are formed on the upper surface of the wiring substrate 100. The electrode pads 101 are connected to the semiconductor device 10 through bumps 102. The wiring substrate 100 is, for example, an organic-based substrate (organic substrate). Preferably, the organic substrate may include fibers such as glass fibers. The electrode pads 101 are made of a material such as copper (Cu), nickel (Ni), or a nickel alloy. For example, the bumps 102 are solder bumps. The wiring substrate 100 has conductive members (not shown) which are connected to the electrode pads 101. For example, the conductive members include one or more wiring layers and vias which are formed inside the wiring substrate 100. The wiring substrate 100 is, for example, a core build-up substrate having a core substrate, or a coreless substrate having no core substrate.

The semiconductor device 10 has semiconductor chips 20, 80 and an intermediate substrate 30.

The semiconductor chip 20 is provided over the upper surface of the wiring substrate 100. The intermediate substrate 30 is provided over an upper surface of the semiconductor chip 20. The semiconductor chip 80 is mounted over an upper surface of the intermediate substrate 30.

The semiconductor chips 20, 80 are examples of electronic components. For example, the semiconductor chip 20 is a memory, and the semiconductor chip 80 includes a circuit (for example, a CPU) which is to accesses the memory. Alternatively, the semiconductor chip 80 may be a memory, and the semiconductor chip 20 may be a circuit (for example, a CPU) which is connected to the memory.

The semiconductor chips 20, 80 are formed into, for example, a rectangle shape in plan view.

The semiconductor chip 20 has a device surface (an upper surface in FIG. 1) 21 and a rear face (a lower surface in FIG. 1) 22 which is opposite to the device surface 21. Devices such as logic circuits (memory circuits), and wirings are formed on the device surface 21 (the devices and the wirings are not shown).

Electrode pads 23 are formed on the device surface 21 of the semiconductor chip 20. Similarly, electrode pads 24 are formed on the rear surface 22. The electrode pads 23, 24 are made of a material such as copper (Cu), nickel (Ni), or a nickel alloy.

Through holes 25 which penetrate between the device surface 21 and the rear surface 22 are formed in the semiconductor chip 20. Through electrodes 26 are formed in the through holes 25, respectively. A material of the through electrodes 26 is, for example, copper. Although not shown, an insulating film made of a silicon oxide film or the like is formed on an inner peripheral surface of each the through hole 25, and the insulating film insulates the through electrodes 26 from a substrate body (silicon substrate) of the semiconductor chip 20. The through electrodes 26 electrically connect the electrode pads 24 on the rear surface 22 to the wiring (not shown) on the device surface 21. Therefore, the circuits including elements and the like formed on the device surface 21 of the semiconductor chip 20 are connected to the electrode pads 24 on the rear surface 22 through the through electrodes 26.

The electrode pads 24 on the rear surface 22 are electrically connected to the electrode pads 101 of the wiring substrate 100 through the bumps 102, respectively. The electrode pads 23 on the device surface 21 are connected to the intermediate substrate 30 through bumps 91. The bumps 91 are, for example, solder bumps.

The intermediate substrate 30 is an example of an interposer. The intermediate substrate 30 has a substrate body 31. The substrate body 31 is formed into, for example, a rectangle shape in plan view. A material of the substrate body 31 is, for example, silicon (Si).

Through holes 32 which penetrate between a first surface (upper surface) 31a and a second surface (lower surface) 31b are formed in the substrate body 31. Through electrodes 33 are formed in the through holes 32, respectively. A material of the through electrodes 33 is, for example, copper.

A plurality of electrode pads 34 are formed on the upper surface 31a of the substrate body 31. The electrode pads 34 are connected to the semiconductor chip 80 through bumps 92. A plurality of electrode pads 35 are formed on the lower surface 31b of the substrate body 31. The electrode pads 35 are examples of terminals. The electrode pads 34, 35 are made of a material such as copper (Cu), nickel (Ni), or a nickel alloy. The electrode pads 34 and the electrode pads 35 are electrically connected to each other through the through electrodes 33. The electrode pads 35 are electrically connected to the electrode pads 23 of the semiconductor chip 20 through the bumps 91.

The semiconductor chip 80 has a device surface (a lower surface in FIG. 1) 81 and a rear face (an upper surface in the FIG. 82 which is opposite to the device surface 81. Devices such as logic circuits, and wirings are formed on the device surface 81 (the devices and the wirings are not shown).

Electrode pads 83 are formed on the device surface 81 of the semiconductor chip 80. A material of the electrode pads 83 is, for example, copper. The electrode pads 83 are electrically connected to the electrode pads 34 of the intermediate substrate 30 through the bumps 92. The bumps 92 are, for example, solder bumps. Therefore, the semiconductor chip 80 is flip-chip mounted on the intermediate substrate 30.

As described above, the intermediate substrate 30 has the through electrodes 33 which penetrate the substrate body 31 from the upper surface 31a of the substrate body 31 to the lower surface 31b of the substrate body 31, and the through electrodes 33 electrically connect the electrode pads 34 formed on the upper surface 31a to the electrode pad 35 formed on the lower surface 31b. Therefore, the circuits including the elements and wirings formed on the device surface 81 of the semiconductor chip 80 are connected to the circuits of the semiconductor chip 20 through the through electrodes 33 and the like of the intermediate substrate 30.

A gap between the wiring substrate 100 and the semiconductor chip 20 is filled with an under-fill resin 103. The under-fill resin 103 has a fillet which extends gently inclinedly from a lower portion of a side surface of the semiconductor chip 20 toward the upper surface of the wiring substrate 100. Similarly, a gap between the semiconductor chip 20 and the intermediate substrate 30 is filled with an under-fill resin 93. The under-fill resin 93 has a fillet which extends gently inclinedly from a lower portion of a side surface of the intermediate substrate 30 toward the device surface 21 of the semiconductor chip 20. A gap between the intermediate substrate 30 and the semiconductor chip 80 is filled with an under-fill resin 94. The under-fill resin 94 has a fillet which extends gently inclinedly from a lower portion of a side surface of the semiconductor chip 80 toward the upper surface (upper surface 31a of the substrate body 31) of the intermediate substrate 30.

A material of the under-fill resins 93, 94, 103 is, for example, an insulating resin such as an epoxy resin or a polyimide resin, or a resin material in which a filler such as silica or alumina is mixed with such a resin. The under-fill resins 93, 94, 103 improve the connection strengths between the respective ones of the substrates. Moreover, the under-fill resins 93, 94, 103 suppress corrosion of the electrode pads formed on the substrates, occurrence of electromigration, reduction of reliability of the wirings (breakage of the wirings due to stress applied to the electrode pads), and the like.

The filler such as alumina contained in the under-fill resins 93, 94 is higher in thermal conductivity than the main components of the under-fill resins 93, 94. Such a filler increases the thermal conductivities of the under-fill resins 93, 94 so as to transfer heat generated on the device surfaces 21, 81 of the semiconductor chips 20, 80 to the intermediate substrate 30. The filler may be a metal material whose surface is covered by an insulating material (for example, a resin material). Examples of the metal material include gold (Au), silver (Ag), copper (Cu), aluminum (Al), nickel (Ni), chromium (Cr), and cobalt (Co).

A flow path 36 is formed inside the intermediate substrate 30. The flow path 36 is filled with refrigerant for cooling the semiconductor chips 20, 80. The refrigerant is, for example, liquid or gas such as water, alcohol, or fluorine.

The flow path 36 has a plurality of main cooling flow paths 36a, an inflow path 36b, and an outflow path 36c. The main cooling flow paths 36a are formed in a center portion of the substrate body 31. The inflow path 36b allows the refrigerant to flow into the main cooling flow paths 36a. The outflow path 36c allows the refrigerant in the main cooling flow paths 36a to flow out. Widths of the inflow path 36b and the outflow path 36c are larger than that of the main cooling flow paths 36.

An inflow port 37 is formed in the intermediate substrate 30 so as to penetrate from the upper surface 31a of the substrate body 31 to an inner surface of the inflow path 36b. The inflow port 37 is formed into a circular shape in plan view. An end portion of a pipe 111 for circulating the refrigerant is inserted into the inflow port 37. The pipe 111 is, for example, made of a metal such as copper or brass. The pipe 111 is an example of a first pipe.

A stopper 50 is attached to the inner surface (ceiling surface) of the inflow path 36b. The stopper 50 has an abutment member 51 against which a tip end of the pipe 111 abuts, and a connecting member 52 that connects the abutment member 51 to the inner surface of the inflow path 36b. The abutment member 51 and the connecting member 52 are formed into annular shapes. On the upper surface 31a of the substrate body 31, a connection pad 53 is formed in a periphery of the inflow port 37. The connection pad 53 is formed into, for example, an annular shape.

The connection pad 53 and the stopper 50 are used for fixing the pipe 111 to the substrate body 31. The tip end of the pipe 111 abuts against the upper surface of the stopper 50 (abutment member 51). A gap between a peripheral surface of the pipe 111 and the inner surface of the inflow port 37 is filled with solder 54 that connects the pipe 111 to the stopper 50. Moreover, the solder 54 connects the peripheral surface of the pipe 111 to the connection pad 53. The stopper 50 is an example of a first member.

The portion where the intermediate substrate 30 and the pipe 111 are connected to each other is covered by a resin 55. The resin 55 is formed so as to cover the connection pad 53 and the solder 54 which connects the connection pad 53 and the pipe 111. Examples of a material of the resin 55 include a resin such as an epoxy resin, a silicone resin, and a polyimide resin, and a resin material in which a filler such as silica, alumina, and aluminum nitride is mixed with such a resin.

An outflow port 38 is formed in the intermediate substrate 30 so as to penetrate from the upper surface 31a of the substrate body 31 to the inner surface of the outflow path 36c. The outflow port 38 is formed into a circular shape in plan view. An end portion of a pipe 112 for circulating the refrigerant is inserted into the outflow port 38. The pipe 112 is, for example, made of a metal such as copper or brass. The pipe 112 is an example of a second pipe.

A stopper 60 is attached to the inner surface (ceiling surface) of the outflow path 36c. The stopper 60 has an abutment member 61 against which a tip end of the pipe 112 abuts, and a connecting member 62 that connects the abutment member 61 to the inner surface of the outflow path 36c. The abutment member 61 and the connecting member 62 are formed into annular shapes. On the upper surface 31a of the substrate body 31, a connection pad 63 is formed in a periphery of the outflow port 38. The connection pad 63 is formed into, for example, an annular shape.

The connection pad 63 and the stopper 60 are used for fixing the pipe 112 to the substrate body 31. The tip end of the pipe 112 abuts against the upper surface of the stopper 60 (abutment member 61). A gap between a peripheral surface of the pipe 112 and the inner surface of the outflow port 38 is filled with solder 64 that connects the pipe 112 to the stopper 60. Moreover, the solder 64 connects the peripheral surface of the pipe 112 to the connection pad 63. The stopper 60 is an example of a second member.

The portion where the intermediate substrate 30 and the pipe 112 are connected to each other is covered by a resin 65. The resin 65 is formed so as to cover the connection pad 63 and the solder 64 which connects the connection pad 63 and the pipe 112. Examples of a material of the resin 65 include a resin such as an epoxy resin, a silicone resin, and a polyimide resin, and a resin material in which a filler such as silica, alumina, and aluminum nitride is mixed with such a resin.

The pipes 111, 112 are connected to a pump (not shown) and a heat converter which dissipates heat of the refrigerant to, for example, the atmosphere. As indicated by arrows in FIG. 1, the pipe 111 is used for supplying the refrigerant to the flow path 36, and the pipe 112 is used for guiding the refrigerant, flowing out from the flow path 36, to the heat converter. The refrigerant is circulated by the pump between the intermediate substrate 30 and the heat converter through the pipes 111, 112. The circulation of the refrigerant cools the intermediate substrate 30 and the semiconductor chips 20, 80, which are connected to the intermediate substrate 30.

For example, the substrate body 31 has 300 μm (microns) in thickness. For example, the flow path 36 has 200 μm in height (length in a vertical direction). The inflow path 36b and the outflow path 36c have, for example, 5 mm in width. The main cooling flow paths 36a have, for example, 100 μm in width. The inflow port 37 and the outflow port 38 have, for example, 2.4 mm in diameter. The abutment members 51, 61 have, for example, 4.4 mm in outer diameter and 1.4 mm in inner diameter. The outer diameters of the connecting members 52, 62 are equal to those of the abutment members 51, 61, and the inner diameters of the connecting members 52, 62 are equal to the diameters of the inflow port 37 and the outflow port 38.

Figure 2:
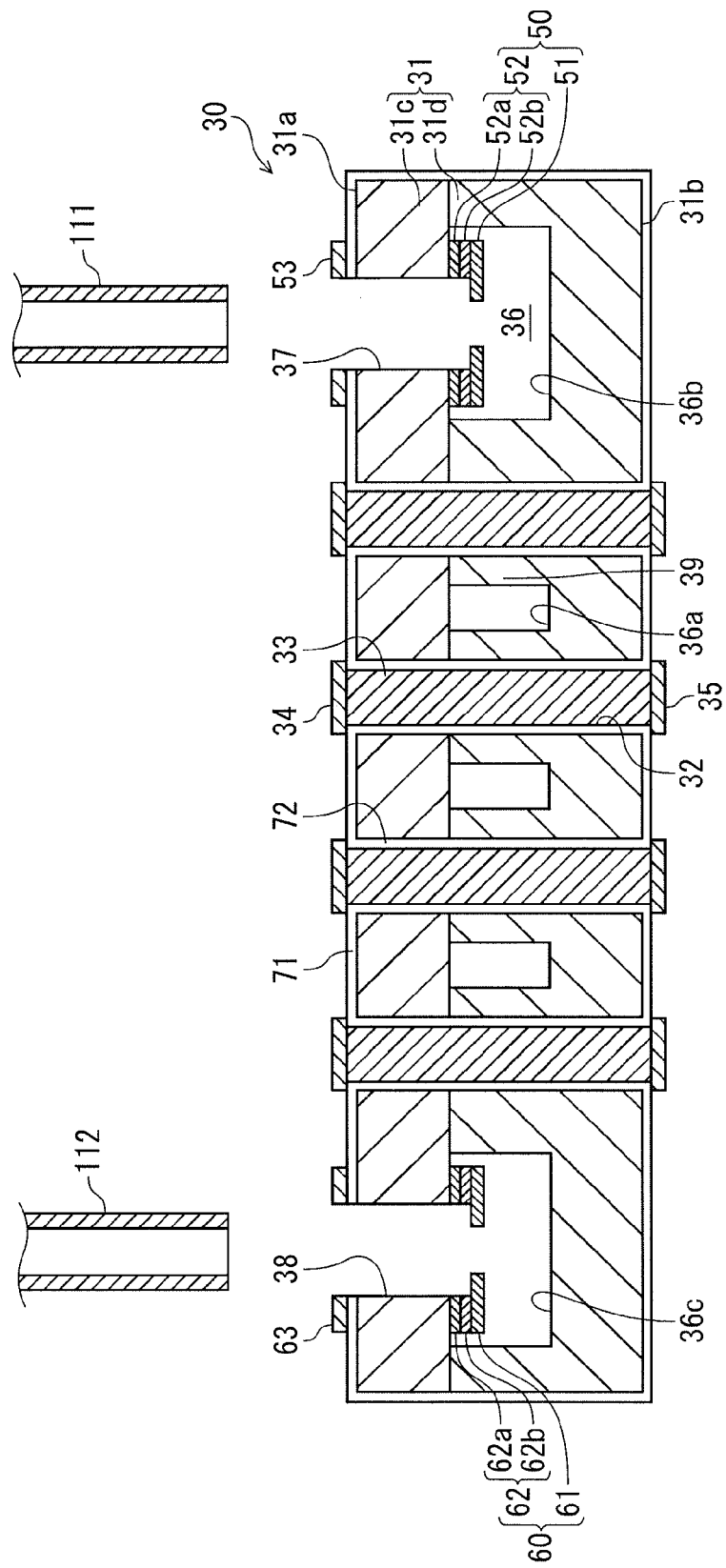
FIG. 2 is a schematic section view of an intermediate substrate.

As shown in FIG. 2, an insulating film 71 is formed on surfaces (upper, lower, and side surfaces) of the substrate body 31 of the intermediate substrate 30. The through holes 32 are formed in the substrate body 31, and an insulating film 72 is formed on an inner peripheral surface of each through hole 32. The through electrodes 33 formed in the through holes 32 are insulated from the substrate body 31 by the insulating films 72. For example, the substrate body 31 is a silicon substrate, and the insulating films 71, 72 are silicon oxide films (SiO).

A plurality of inner walls 39 are formed in a middle portion of the intermediate substrate 30. The inner walls 39 partition the inner space of the intermediate substrate 30 so as to form the main cooling flow paths 36a. The refrigerant flows along the inner walls 39 constituting the main cooling flow paths 36a. The through electrodes 33 are disposed to penetrate through the inner walls 39 from the upper surface 31a of the substrate body 31 to the lower surface 31b of the substrate body 31.

For example, the intermediate substrate 30 is formed by bonding two substrates 31c, 31d together. The first substrate 31c is formed with the inflow port 37 and the outflow port 38. The second substrate 31d is formed with recesses corresponding to the flow path 36. The flow path 36 is formed by covering the recesses by the first substrate 31c.

The through holes 32 are formed to penetrate through the first substrate 31c and the second substrate 31d.

The stopper 50 has the abutment member 51 and the connecting member 52. The connecting member 52 has, for example, a two-layer structure configured by a titanium (Ti) layer 52a and a nickel (Ni) layer 52b. The titanium layer 52a is formed on the inner wall (ceiling surface) of the flow path 36, i.e., a lower surface of the first substrate 31c. The nickel layer 52b is formed on a lower surface of the titanium layer 52a. The abutment member 51 is formed on a lower surface of the nickel layer 52b. The abutment member 51 is made of, for example, copper. Namely, a copper layer is formed on the lower surface of the nickel layer 52b.

The stopper 60 has the abutment member 61 and the connecting member 62. The connecting member 62 has, for example, a two-layer structure configured by a titanium (Ti) layer 62a and a nickel (Ni) layer 62b. The titanium layer 62a is formed on the inner wall (ceiling surface) of the flow path 36, i.e., the lower surface of the first substrate 31c. The nickel layer 62b is formed on a lower surface of the titanium layer 62a. The abutment member 61 is formed on a lower surface of the nickel layer 62b. The abutment member 61 is made of, for example, copper. Namely, a copper layer is formed on the lower surface of the nickel layer 62b.

Next, functions of the semiconductor device 10 will be described.

As shown in FIG. 1, the semiconductor device 10 has the intermediate substrate 30 and the semiconductor chips 20, 80. The semiconductor chip 20 mainly generates heat on the device surface 21 side on which elements (transistors, resistors, and the like) included in the circuits are formed. The electrode pads 23 and the bumps 91 which are formed on the device surface 21 transfer the heat, which is generated in the device surface 21 of the semiconductor chip 20, to the through electrodes 33 of the intermediate substrate 30. Similarly, the semiconductor chip 80 mainly generates heat on device surface 81 side on which elements (transistors, resistors, and the like) included in the circuits are formed. The electrode pads 83 and the bumps 92 which are formed on the device surface 81 transfer the heat, which is generated in the device surface 81 of the semiconductor chip 80, to the through electrodes 33 of the intermediate substrate 30. As shown in FIG. 2, the through electrodes 33 penetrate through the inner walls 39 of the intermediate substrate 30. Therefore, the heat of the through electrodes 33 is transferred to the inner walls 39. The inner walls 39 are cooled by heat exchange with the refrigerant. Consequently, the semiconductor chips 20, 80 shown in FIG. 1 are cooled by the intermediate substrate 30 connected to the electrode pads 23, 83 of the device surfaces 21, 81.

The tip end of the pipe 111, which supplies the refrigerant to the flow path 36 of the intermediate substrate 30, abuts against the stopper 50 attached to the inner surface of the flow path 36. Therefore, the pipe 111 is positioned by the stopper 50. Similarly, the tip end of the pipe 112 into which the refrigerant flows from the flow path 36 of the intermediate substrate 30 abuts against the stopper 60 attached to the inner surface of the flow path 36. Therefore, the pipe 112 is positioned by the stopper 60. The gap between the inner surface of the inflow port 37 and the outer peripheral surface of the pipe 111 is filled with the solder 54. The pipe 111 is connected to the stopper 50 by the solder 54. The pipe 111 is connected to the connection pad 53 by the solder 54. Similarly, the gap between the inner surface of the outflow port 38 and the outer peripheral surface of the pipe 112 is filled with the solder 64. The pipe 112 is connected to the stopper 60 by the solder 64. The pipe 112 is connected to the connection pad 63 by the solder 64. Therefore, as compared with the case where the pipes 111, 112 are connected to the substrate body 31 by, for example, a resin, the configuration where the pipes 111, 112 are connected to the substrate body 31 by the solders 54, 64 reduces failures such as disconnection of the pipes 111, 112 and leakage of the refrigerant from between the pipes 111, 112 and the substrate body 31.

Next, a manufacturing process of the intermediate substrate 30 will be described.

Components which are not directly related to the manufacturing process may be omitted in the drawings which the following description refers to.

Figure 3A:
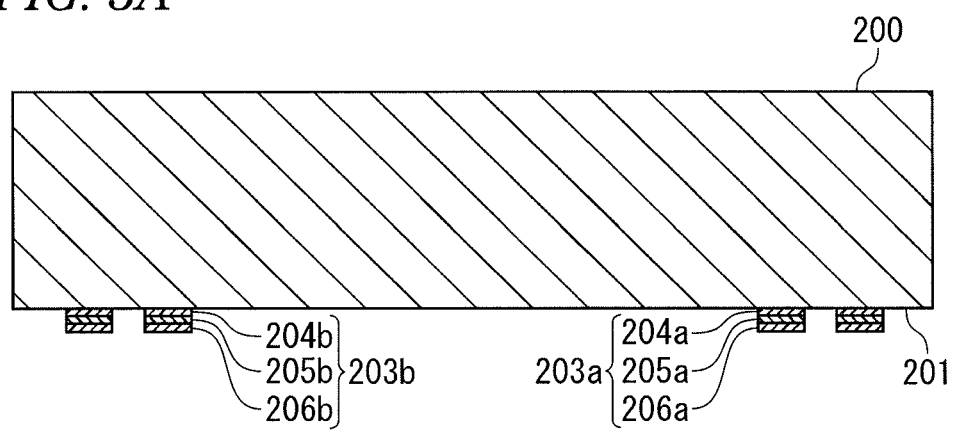
FIGS. 3A and 3B are schematic section views showing a manufacturing process.

As shown in FIG. 3A, first, a substrate 200 having a predetermined thickness is prepared. The substrate 200 is, for example, a silicon wafer.

Metal layers 203a, 203b which will serve as the stoppers 50, 60 are formed on one surface (a lower surface in FIG. 3A) of the substrate 200. The metal layer 203a has a titanium layer 204a, a nickel layer 205a, and a copper layer 206a. Similarly, the metal layer 203b has a titanium layer 204b, a nickel layer 205b, and a copper layer 206b.

For example, a titanium layer is formed by the sputtering method on the whole surface 201 of the substrate 200. The film thickness of the titanium layer is, for example, 0.1 μm. Next, a nickel layer is formed by the sputtering method or the like on a surface of the titanium layer. The film thickness of the nickel layer is, for example, 1 μm. Next, a copper layer is formed by the sputtering method or the like on a surface of the nickel layer. The film thickness of the copper layer is, for example, 0.5 μm. Next, a resist film is formed so as to cover the whole surface of the copper layer. The resist film is obtained by, for example, application of a liquid resist material or attachment of a sheet-like resist material. Then, openings are formed in the resist film by, for example, photolithography. Shapes and sizes of the openings are identical with those of the abutment members 51, 61 shown in FIG. 1. Then, copper plating is performed on the copper layer through the openings of the resist film to form a copper layer. The thickness of the copper plating is, for example, 5 μm. The illustrated copper layer includes the copper layer formed by the plating and that formed by the sputtering method. The abutment members 51, 61 are formed by these copper layers. Then, the resist film is removed by, for example, ashing, and, in the metal layers formed by the sputtering method, the portions exposed from the abutment members 51, 61 are removed by, for example, dry etching. As a result, the metal layers 203a, 203b are obtained.

Figure 3B:
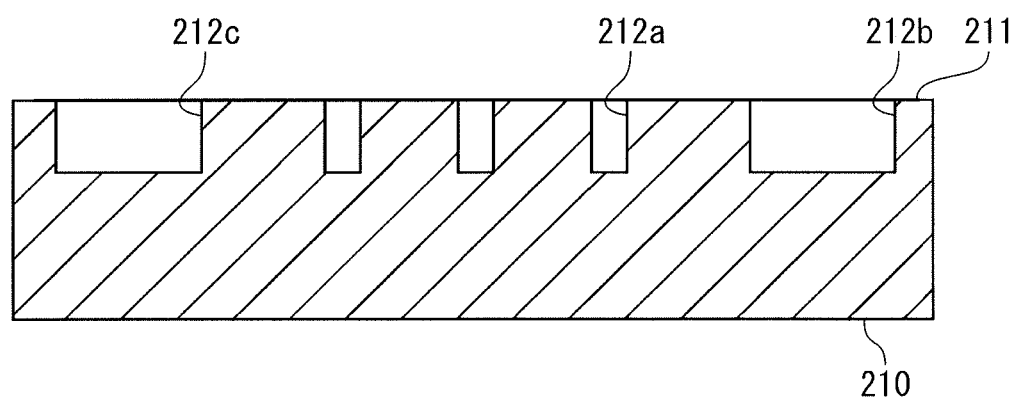

Next, a substrate 210 having a predetermined thickness is prepared as shown in FIG. 3B. The substrate 210 is, for example, a silicon wafer.

Recesses 212a to 212c corresponding to the flow path 36 shown in FIG. 1 are formed on one surface (upper surface in FIG. 3B) 211 of the substrate 210. The recess 212a corresponds to the main cooling flow paths 36a shown in FIG. 2. The recess 212b corresponds to the inflow path 36b shown in FIG. 2. The recess 212c corresponds to the outflow path 36c shown in FIG. 2. The depths of the recesses 212a to 212c correspond to the height of the flow path 36 shown in FIG. 2, and are, for example, 200 μm.

For example, a resist film is formed so as to cover the whole surface 211 of the substrate 210. The resist film is obtained by, for example, application of a liquid resist material or attachment of a sheet-like resist material. Then, openings which correspond to the flow path 36 shown in FIG. 1 are formed in the resist film by, for example, photolithography. Then, dry etching or the like is performed through the openings of the resist film to form the recesses 212a to 212c in the substrate 210. Then, the resist film is removed by, for example, ashing.

Figure 4A:
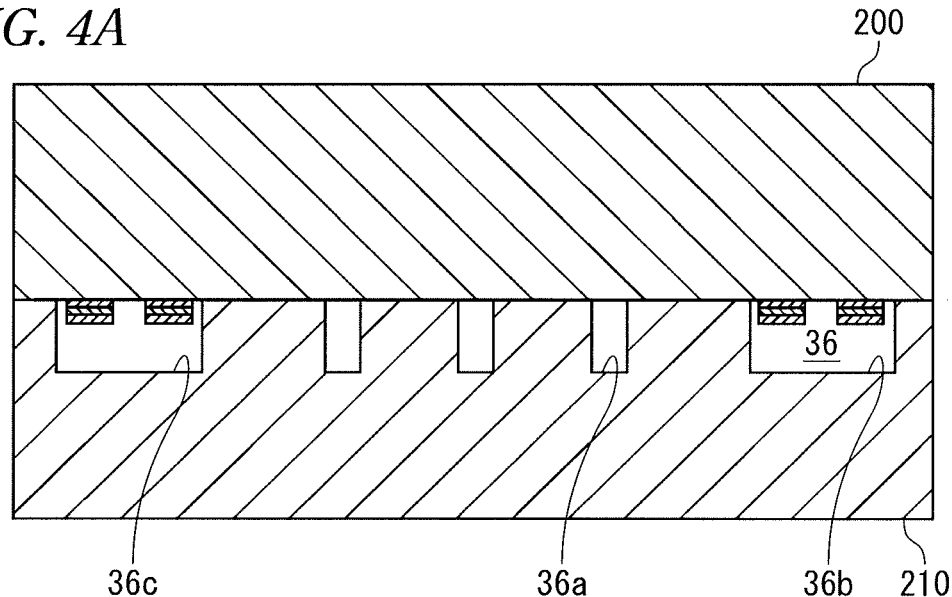
FIGS. 4A to 4C are schematic section views showing the manufacturing process.

As shown in FIG. 4A, next, the substrate 200 and the substrate 210 are bonded together by, for example, normal temperature bonding. The flow path 36 is formed by the bonding of the substrate 200 and the substrate 210. The substrate 200 and the substrate 210 may be bonded together by plasma process or pressure process. In the plasma process, bonding surfaces of two substrates are exposed to plasma (for example, plasma using argon (Ar) gas) to remove oxide films, contaminations, and the like on the bonding surfaces, the bonding surfaces are brought to abut against each other in a state where oxide films and the like are completely eliminated, and then the bonding surfaces are bonded together by pressurization. In the pressure process, two substrates are bonded together by applying a pressure and heat at a degree where noticeable plastic deformation is not caused in the substrates.

Figure 4B:
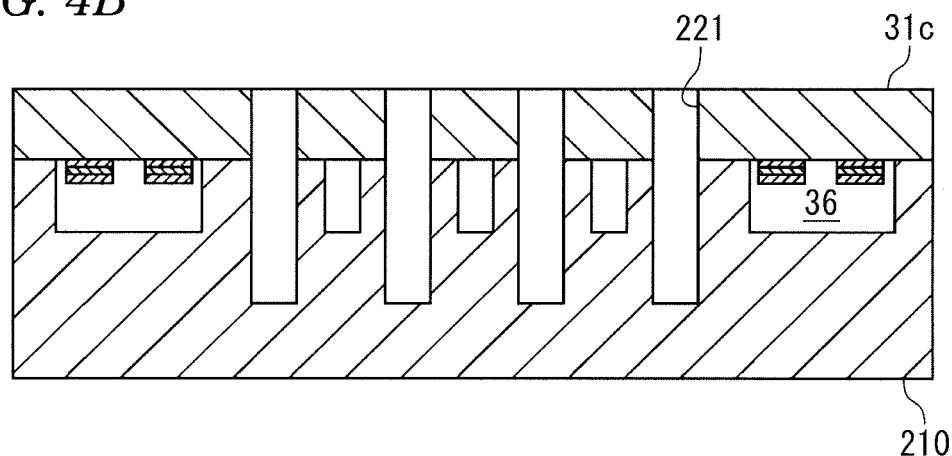

As shown in FIG. 4B, next, the substrate 200 (see FIG. 4A) is thinned to form the substrate 31c. The thinning (formation of the substrate 31c) of the substrate 200 is performed by the CMP (Chemical Mechanical Polishing), wet etching in a chemical solution containing nitric acid (HNO3) or hydrogen fluoride (HF), plasma etching (dry etching), grinding with a grinding stone, polishing, or the like.

From the upper surface of the substrate 31c, next, fine holes 221 corresponding to the through holes 32 shown in FIG. 1 are formed in the substrate 31c and the substrate 210. For example, a resist film is formed so as to cover the whole surface of the substrate 31c. The resist film is, for example, a photosensitive resist film, and may be formed by using a sheet-like resist film (dry film) or a liquid resist agent. Then, openings corresponding to the through holes 32 shown in FIG. 1 are formed in the resist film by, for example, photolithography. Then, anisotropic etching is performed through the openings to form the fine holes 221. Thereafter, the resist film is removed by ashing or the like. The anisotropic etching is, for example, the DRIE (Deep Reactive Ion Etch).

Figure 4C:
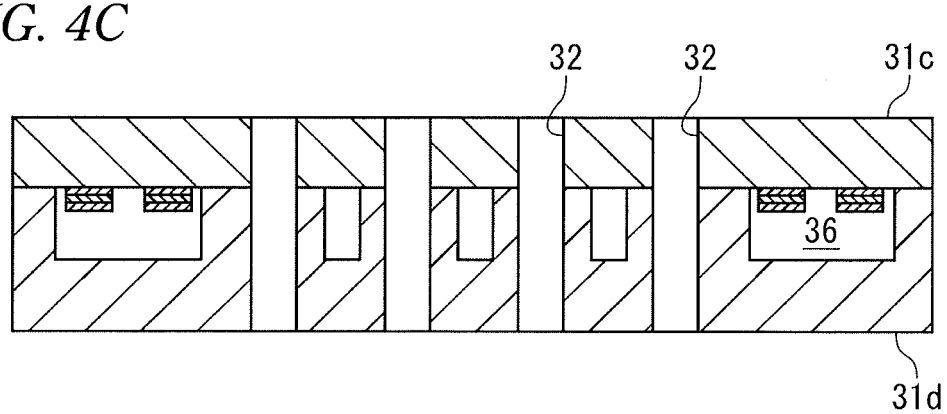

As shown in FIG. 4C, next, the substrate 210 (see FIG. 4B) is thinned to form the substrate 31d. By the thinning of the substrate 210 (formation of the substrate 31d), the substrate body 31 including the substrates 31c, 31d is formed, and the through holes 32 which penetrate through the substrate body 31 from the upper surface 31a of the substrate body 31 to the lower surface 31b of the substrate body 31 are formed. The thinning of the substrate 210 (formation of the substrate 31d) is performed by the CMP (Chemical Mechanical Polishing), wet etching in a chemical solution containing nitric acid or hydrogen fluoride, plasma etching (dry etching), grinding with a grinding stone, polishing, or the like.

Figure 5A:
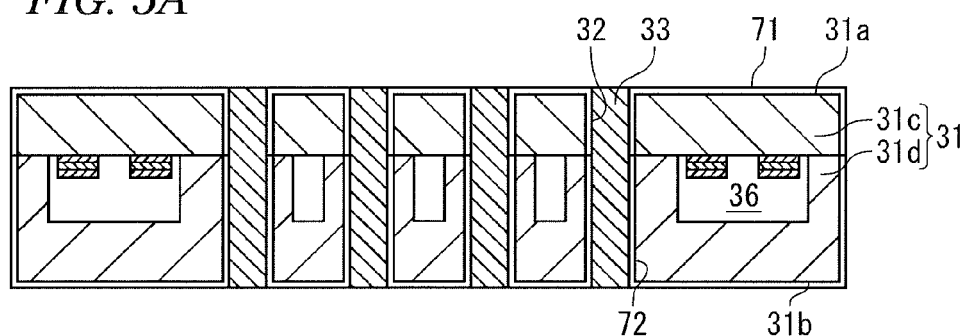
FIGS. 5A to 5C are schematic section views showing the manufacturing process.

As shown in FIG. 5A, next, the insulating films 71, 72 are formed. A silicon oxide film (SiO2) or silicon nitride film (SiN) which is deposited by the CVD (Chemical Vapor Deposition) constitutes the insulating films 71, 72 formed on the surfaces of the substrates 31c, 31d shown in FIG. 4C and the inner wall surfaces of the through holes 32.

Then, the through electrodes 33 are formed in the through holes 32. For example, a metal foil such as a copper foil is attached to the lower surface of the substrate 31d so as to close the openings of the through holes 32 on the substrate 31d side. Next, a plating film is precipitated on the metal foil by electrolytic plating of copper in which the metal foil is used as an electrode, so as to fill the interiors of the through holes 32 with the plating metal. Thereafter, the metal foil is removed, and the plating metal which projects from the openings of the through holes 32 on the substrate 31d side are removed by, for example, the CMP to thereby form the through electrodes 33. Alternatively, the through electrodes 33 may be formed by filling the through holes 32 with conductive paste.

Figure 5B:
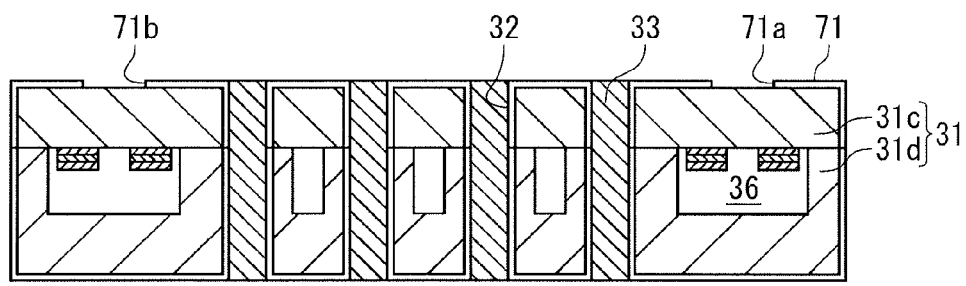

As shown in FIG. 5B, next, openings 71a, 71b corresponding to the inflow port 37 and outflow port 38 shown in FIG. 1 are formed in the insulating film 71. For example, a resist film is formed so as to cover the insulating film 71, and openings are formed in the resist film. Then, etching is performed through the openings of the resin film so as to form the openings 71a, 71b.

Figure 5C:
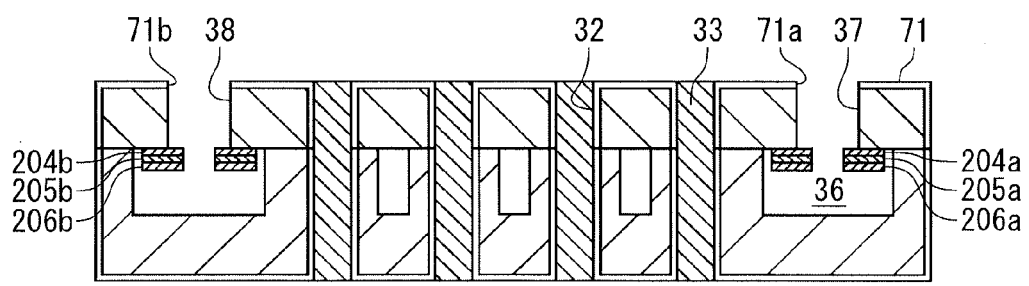

As shown in FIG. 5C, next, the inflow port 37 and the outflow port 38 are formed. Anisotropic etching is performed on the substrate 31c through the openings formed in the resist film, so as to form the inflow port 37 and the outflow port 38. The anisotropic etching is, for example, the DRIE. Then, the resist film is removed by, for example, ashing.

Figure 6A:
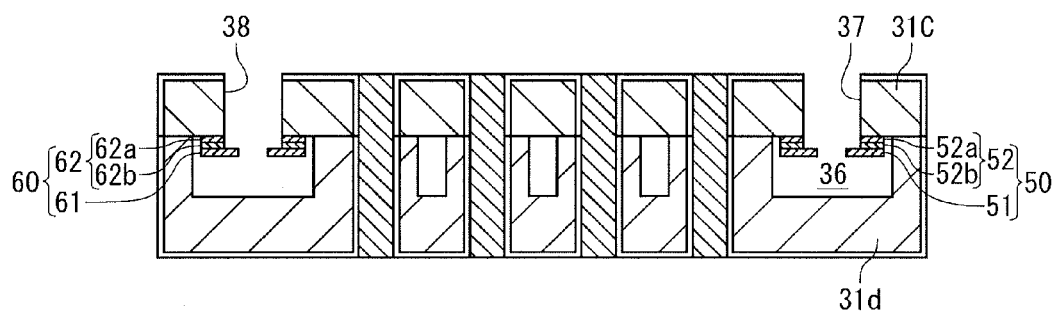
FIGS. 6A to 6C are schematic section views showing the manufacturing process.

As shown in FIG. 6A, next, the connecting member 52 including the titanium layer 52a and the nickel layer 52b is formed. Similarly, the connecting member 62 including the titanium layer 62a and the nickel layer 62b is formed. For example, a resist film is formed so as to cover the substrates 31c, 31d, and then patterning is performed on the resist film to form openings. Then, dry etching is performed through the openings of the resin film so as to remove parts of the metal layers 204a, 205a shown in FIG. 5C, to thereby form the connecting member 52 including the titanium layer 52a and the nickel layer 52b. Similarly, parts of the metal layers 204b, 205b are removed through the openings of the resist film, so as to form the connecting member 62 including the titanium layer 62a and the nickel layer 62b. Alternatively, the connecting members 52, 62 may be formed by wet etching or the like.

Figure 6B:
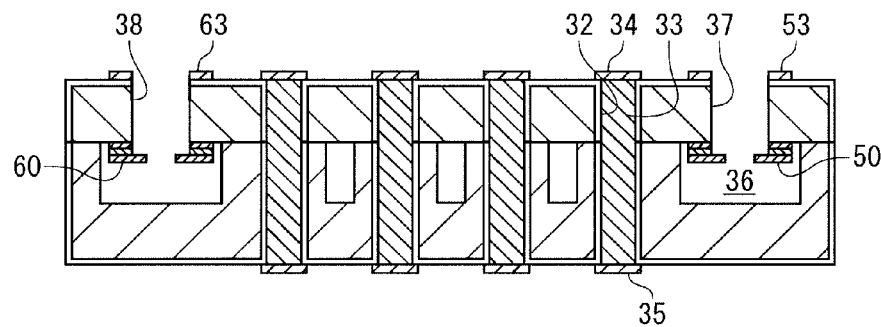

As shown in FIG. 6B, next, the electrode pads 34, 35 and the connection pads 53, 63 are formed. For example, a seed layer is formed in a predetermined region by the sputtering method or electroless plating. Then, a resist film is formed so as to cover the seed layer, and then openings are formed in the resist film by patterning. Then, electrolytic plating is performed on the seed layer through the openings. For example, electrolytic platings of copper (Cu) and nickel (Ni) are sequentially performed on the seed layer to form the electrode pads 34, 35 and the connection pads 53, 63. Alternatively, after the electrolytic plating of nickel, electrolytic plating of gold (Au) may be performed. Further alternatively, nickel and gold layers may be formed by electroless platings.

Next, the connection bumps 92, 91 are formed on surfaces of the electrode pads 34, 35. Moreover, the connection bumps 54, 64 are formed on surfaces of the connection pads 53, 63. For example, paste-like solder is applied to the surfaces of the electrode pads 34, 35 and the connection pads 53, 63, or ball-like solders are placed on the pads 34, 35, 53, 63, and the bumps 91, 92, 54, 64 are formed by reflow. Alternatively, during the formation of the pads 34, 35, 53, 63, solder plating may be applied on the surfaces of the pads 34, 35, 53, 63 to form the bumps.

The thus-formed intermediate substrate 30 and the semiconductor chips 20, 80 are mounted.

As shown in FIG. 1, for example, the intermediate substrate 30 is mounted on the semiconductor chip 20, and the semiconductor chip 80 is mounted on the intermediate substrate 30.

Figure 6C:
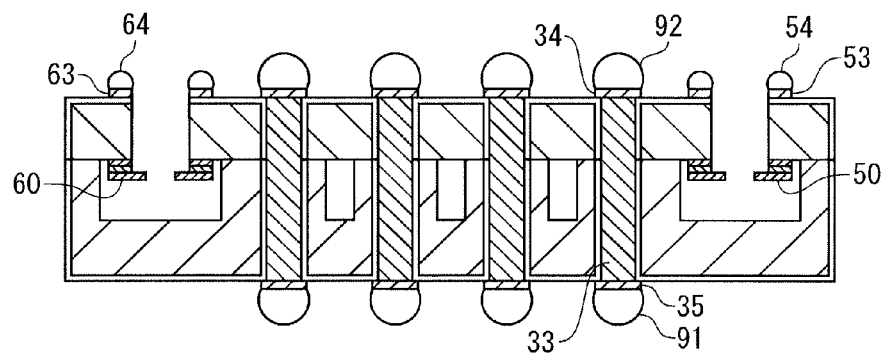

Then, the pipes 111, 112 are connected. For example, the bumps 54, 64 shown in FIG. 6C are heated by a soldering iron to melt the bumps 54, 64, and the pipes 111, 112 are connected to the abutment members 51, 61 and the connection pads 53, 63.

As described above, the following effects are achieved by the above described exemplary embodiment.

(1) The semiconductor chips 20, 80 are connected to the through electrodes 33 of the intermediate substrate 30 by the electrode pads 23, 83 formed on the device surfaces 21, 81. The flow path 36 is formed inside the intermediate substrate 30, and the refrigerant flows into the flow path 36. Then, heat is exchanged between the inner walls 39 of the intermediate substrate 30 and the refrigerant. As compared with a case where the semiconductor chips 20, 80 are cooled through the rear surfaces thereof, therefore, the semiconductor chips 20, 80 can be more efficiently cooled.

(2) The stoppers 50, 60 are attached to the inner surface of the flow path 36. The stoppers 50, 60 have the metal-made abutment members 51, 61. The tip ends of the pipes 111, 112 abut against the abutment members 51, 61, and the abutment members 51, 61 are connected to the pipes 111, 112 by the solders 54, 64. As compared with the case where the abutment members 51, 61 are connected to the pipes 111, 112 by a resin or the like, the solders 54, 64 less deteriorate due to aging and the like. Consequently, it is possible to prevent leakage of the refrigerant.

(3) The solders 54, 64 which connect the abutment members 51, 61 to the pipes 111, 112 are covered by the resins 55, 65. Therefore, it is possible to prevent leakage of the refrigerant.

(4) The gaps between (i) the inflow and outflow ports 37, 38 and (ii) the pipes 111, 112 are filled with the solders 54, 64 which connect the pipes 111, 112 to the stoppers 50, 60. Therefore, the pipes 111, 112 can be fixed, and leakage of the refrigerant can be prevented by the solders 54, 64.

The above-described exemplary embodiment may be implemented in the following manners.

The connection pads 53, 63 may be omitted.

A resin layer may be formed in the intermediate substrate. For example, the resin layer includes an insulating layer and a wiring layer. The wiring layer is formed into a predetermined pattern, and adequately connects the through electrodes.

Outline of a manufacturing process of the intermediate substrate having resin layers will be briefly described.

Figure 7A:
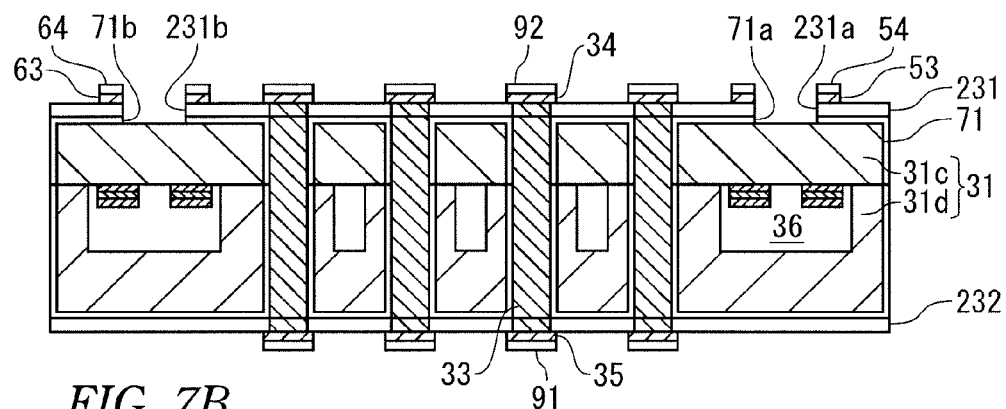
FIGS. 7A to 7C are schematic section views showing the manufacturing process.

First, steps to be performed until the structure shown in FIG. 7A is obtained will be described.

As shown in FIG. 7A, for example, resin layers 231, 232 are formed on the substrates 31c, 31d (shown in FIG. 5B) in which the openings 71a, 71b are formed in the insulating film 71. The resin layers 231, 232 may be made of, for example, an epoxy resin or a polyimide resin. In the resin layer 231 on the upper surface side of the substrate 31c, openings 231a, 231b corresponding to the openings 71a, 71b of the insulating film 71 and openings corresponding to the through electrodes 33 are formed by patterning. Next, a seed layer of titanium (Ti) or copper (Cu) is formed thereon, and a resist film is formed to cover the seed layer. The resist film is patterned to form openings, and copper plating, nickel plating, and solder plating are sequentially performed through the openings to form the electrode pads 34, 35, the connection pads 53, 63, and solder plating layers 92, 91, 54, 64.

Figure 7B:
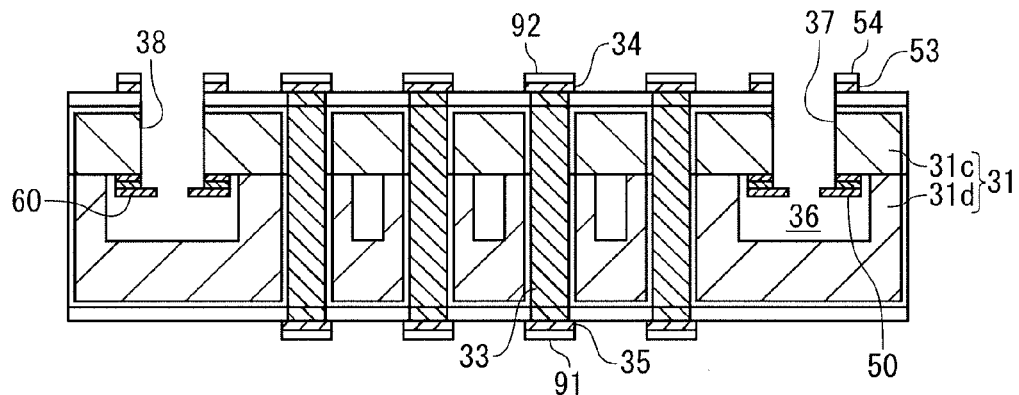

Next, steps which are performed until the structure shown in FIG. 7B is obtained will be described.

First, a resist film is formed to cover the surface, and patterning is performed on the resist film to form openings. The substrate 31c is etched through the openings to form the inflow port 37 and the outflow port 38. Furthermore, the titanium layers 204a, 204b and the nickel layers 205a, 205b are etched through the inflow port 37 and the outflow port 38 to form the connecting members 52, 62.

Figure 7C:
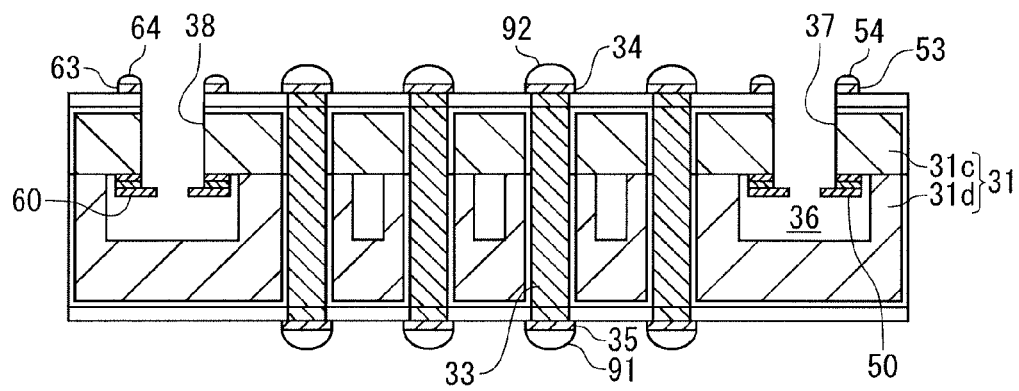

Next, a reflow process is performed to obtain the intermediate substrate 30 which has the bumps 91, 92, 54, 64 as shown in FIG. 7C.

The above-described exemplary embodiment may be modified so that the shapes of the pipes connected to the intermediate substrate 30 may be adequately changed.

Figure 8:
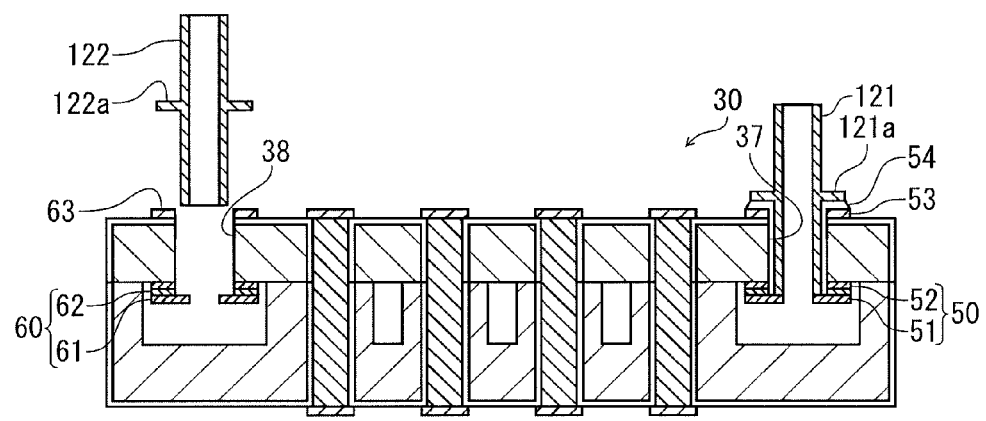
FIG. 8 is a schematic section view of another intermediate substrate.

As shown in FIG. 8, for example, pipes 121, 122 which are formed so as to have a predetermined length have flanges 121a, 122a in center portions thereof, respectively. The pipes 121, 122 are made of a metal such as copper or brass. The flange 121a is connected to the connection pad 53 by the solder 54. A first end portion (lower end portion in FIG. 8) of the pipe 121 is inserted into the inflow port 37, and connected to the stopper 50. A second end portion (upper end portion in FIG. 8) of the pipe 121 protrudes from the substrate body. Although, in FIG. 8, the pipe 122 is separated from the intermediate substrate 30, the flange 122a is connected to the connection pad 63 by solder in a similar manner as in the case of the pipe 121. Pipes for connecting a pump and the like (not shown) are connected to the tip ends (upper ends) of the pipes 121, 122.

Figure 9:
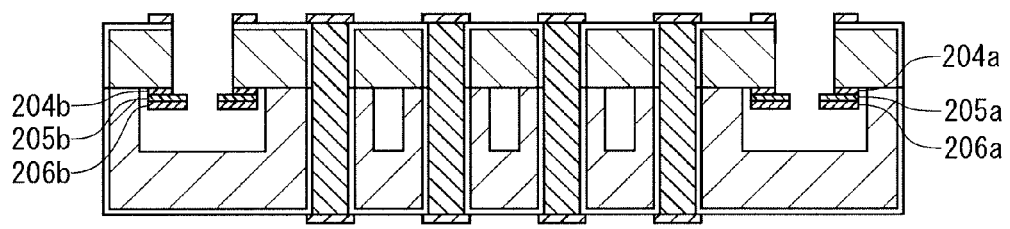
FIG. 9 is a schematic section view of further another intermediate substrate.

The stoppers 50, 60 may be formed by removing parts of the titanium layers 204a, 204b, and leaving the nickel layers 205a, 205b as shown in FIG. 9.

The shapes of the two substrates to be bonded together may be adequately changed.

Figure 10A:
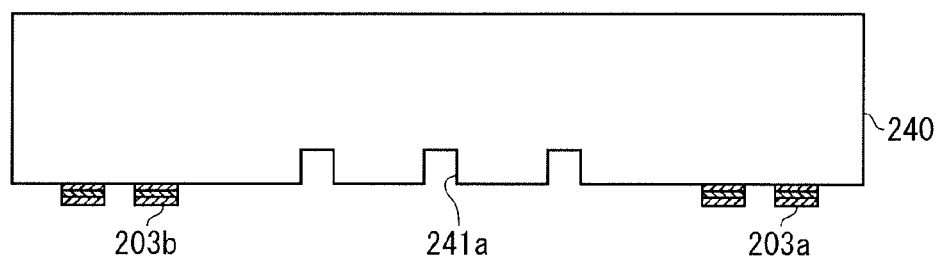
FIGS. 10A to 10D are schematic section views showing another manufacturing process.
Figure 10B:
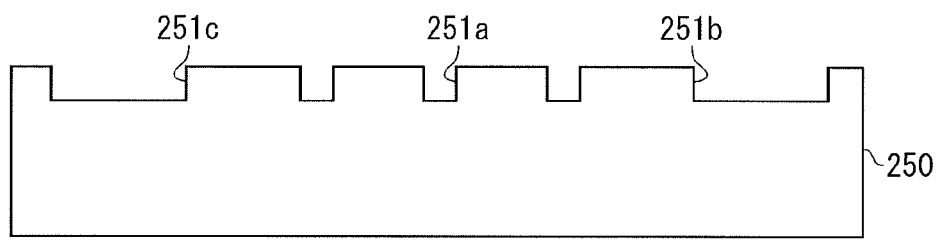
Figure 10C:
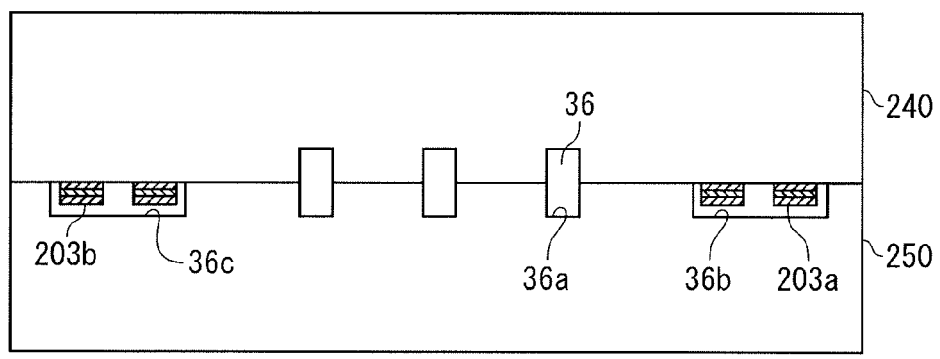
Figure 10D:
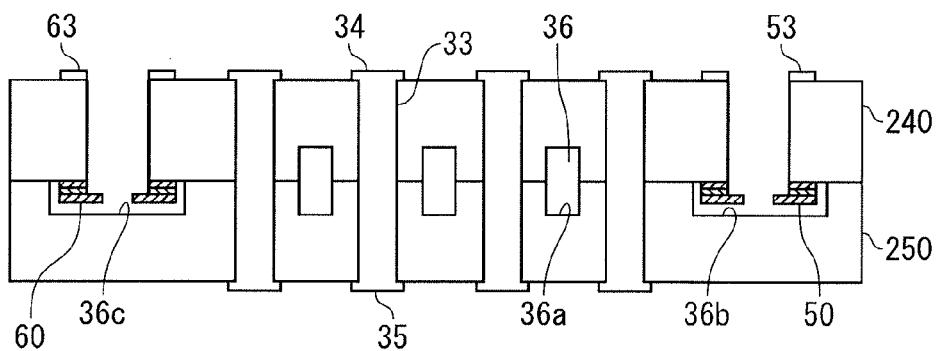

As shown in FIG. 10A, for example, the metal layers 203a, 203b, and recess portions 241a corresponding to the flow path 36 (main cooling flow paths 36a) are formed in a substrate 240. The recess portions 241a have a depth which is, for example, one half of the height of the flow path 36. As shown in FIG. 10B, recess portions 251a to 251c corresponding to the flow path 36 are formed in a substrate 250. The recess portions 251a to 251c have a depth which is, for example, one half of the height of the flow path 36. The heights of the recess portions 241a, 251a to 251c may be adequately changed. As shown in FIG. 10C, next, the substrate 240 and the substrate 250 are bonded together to form the flow path 36. As shown in FIG. 10D, next, the substrates 240, 250 are thinned, and an insulating layer (not shown), the through electrodes 33, the electrode pads 34, 35, and the connection pads 53, 63 are formed.

Figure 11A:
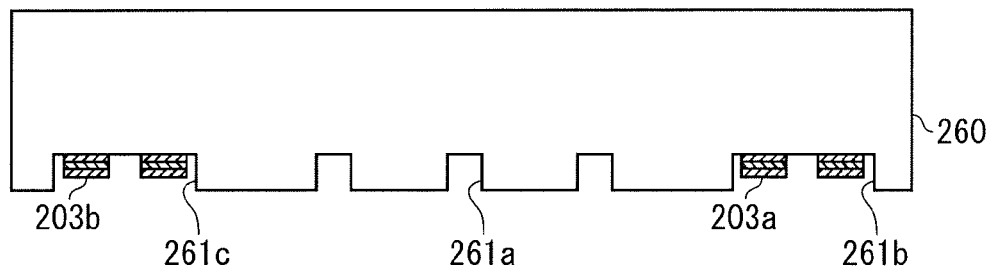
FIGS. 11A to 11D are schematic section views showing further another manufacturing process.
Figure 11B:
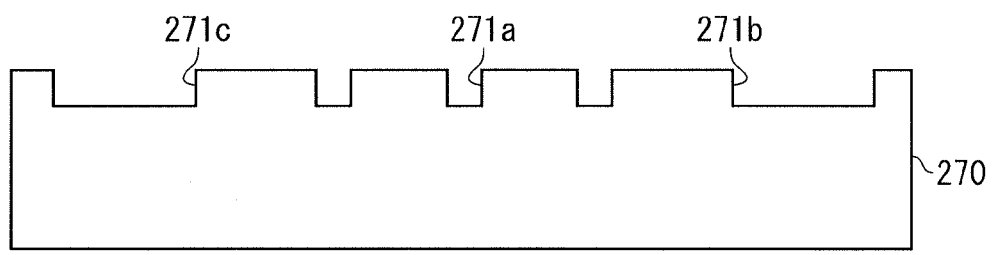
Figure 11C:
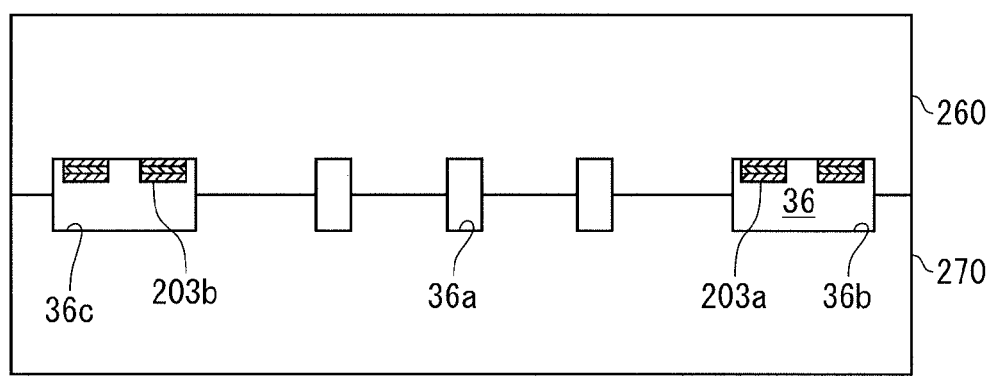
Figure 11D:
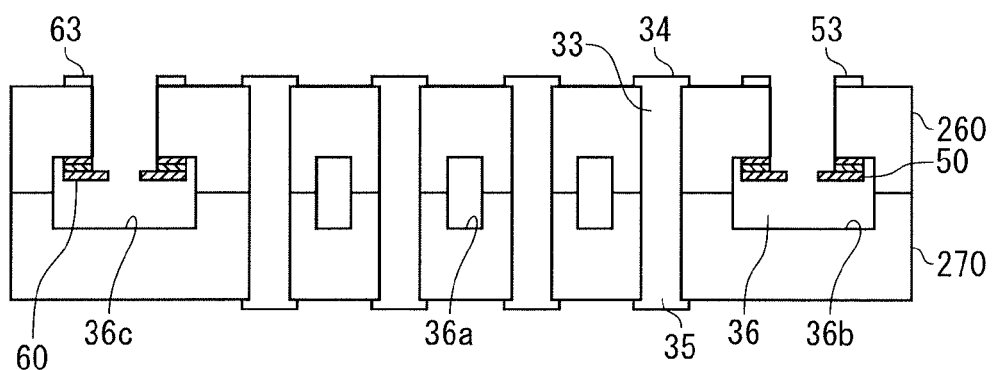

Alternatively, as shown in FIG. 11A, recess portions 261a to 261c corresponding to the flow path 36 are formed in a substrate 260. The recess portions 261a to 261c have a depth which is, for example, one half of the height of the flow path 36. Metal layers 203a, 203b are formed on the bottom surfaces of the recess portions 261b, 261c. As shown in FIG. 11B, recess portions 271a to 271c corresponding to the flow path 36 are formed in a substrate 270. The recess portions 271a to 271c have a depth which is, for example, one half of the height of the flow path 36. The heights of the recesses 261a to 261c and 271a to 271c may be adequately changed. As shown in FIG. 11C, next, the substrate 260 and the substrate 270 are bonded together to form the flow path 36. As shown in FIG. 11D, next, the substrates 260, 270 are thinned, and an insulating layer (not shown), the through electrodes 33, the electrode pads 34, 35, and the connection pads 53, 63 are formed.

The above-described exemplary embodiment may be modified so that through holes or fine holes corresponding to through holes are formed before the bonding of the two substrates. In FIG. 3A, for example, fine holes corresponding to the through holes 32 shown in FIG. 1 are formed in the substrate 200. In FIG. 3B, fine holes corresponding to the through holes 32 shown in FIG. 1 are formed in the substrate 210. The substrate 200 and the substrate 210 are bonded together, and then the substrate 200, 210 are thinned to form the through holes 32.

The above-described exemplary embodiment may be modified so that the through holes are formed after the two substrates are thinned. For example, each of the substrates 200, 210 shown in FIG. 4A is thinned, and thereafter the through holes 32 are formed.

The through electrodes 33 may be formed in the following steps.

Figure 12A:
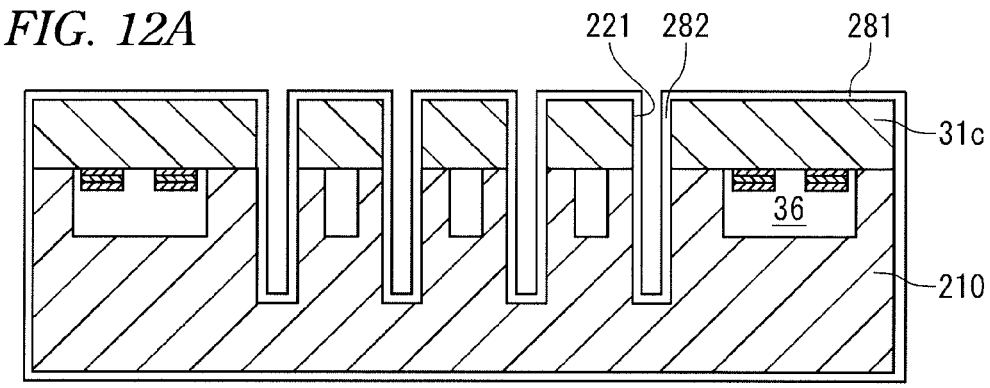
FIGS. 12A to 12C are schematic section views showing still another manufacturing process.

As shown in FIG. 12A, first, insulating films 281, 282 are formed on the surfaces of the substrates 31c, 210 in which the fine holes 221 are formed, and on the inner wall surfaces of the fine holes 221. The insulating films 281, 282 are, for example, silicon oxide films. The insulating films 281, 282 are obtained by, for example, forming a silicon oxide film or silicon nitride film by the CVD method on the substrates 31c, 210 in which the fine holes 221 are formed as shown in FIG. 4B.

Figure 12B:
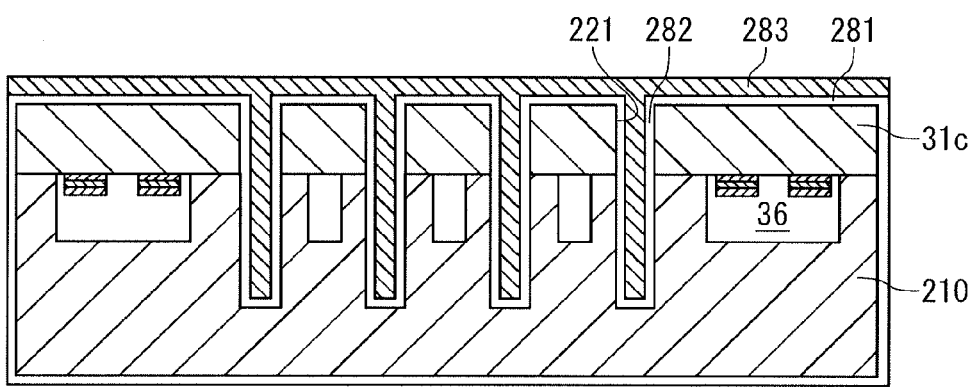

As shown in FIG. 12B, next, a metal layer 283 is formed to cover the upper surface of the insulating film 281. The metal layer 283 fills the fine holes 221. For example, the metal layer 283 is formed by electrolytic plating of copper. A seed layer (not shown) is formed on the upper surface of the insulating film 281 and the surface of the insulating film 282 in the fine holes 221. The seed layer is made of copper or the like, and formed by, for example, electroless plating. Alternatively, a barrier layer of titanium or the like is formed on the surfaces of the insulating films 281, 282, and the seed layer may be formed on the surface of the barrier layer. Next, the metal layer 283 is formed by electrolytic plating of copper in which the seed layer is used as an electrode.

Figure 12C:
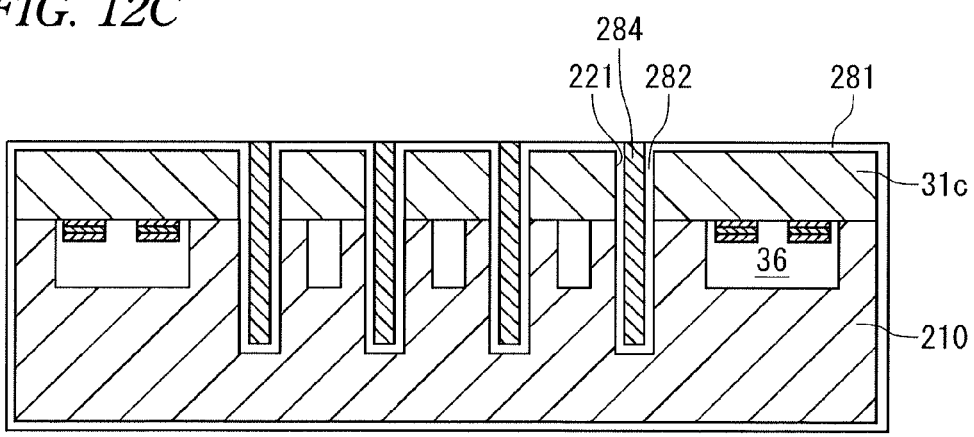

As shown in FIG. 12C, next, the metal layer 283 which covers the surface of the insulating film 281 is removed by, for example, the CMP method. This forms a metal layer 284, surrounded by the insulating film 282, in the fine holes 221. Alternatively, the metal layer 283 on the surface of the insulating film 281 may be removed by wet etching or dry etching.

Figure 13A:
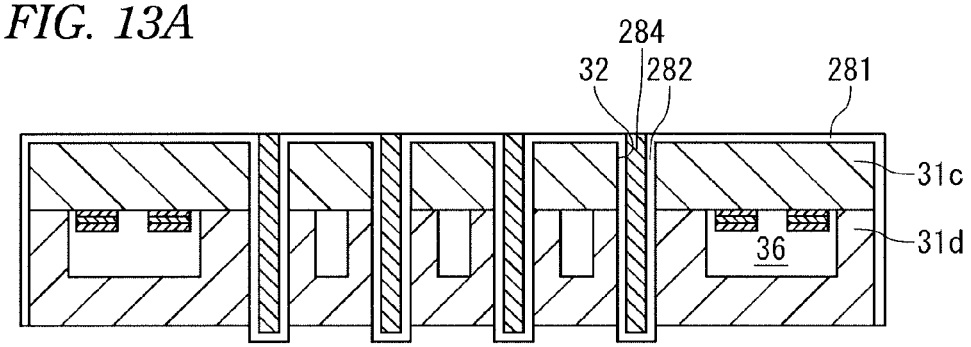
FIGS. 13A and 13B are schematic section views showing the still other manufacturing process.

As shown in FIG. 13A, next, the substrate 210 (see FIG. 12C) is thinned to form the substrate 31d. The substrate 210 is thinned by performing the CMP for and etching (wet etching or dry etching) the lower surface of the substrate 210. As a result of the thinning of the substrate 210 (the formation of the substrate 31d), the insulating film 282 and metal layer 284 which are formed in the fine holes 221 protrude from the lower surface of the substrate 31d.

Figure 13B:
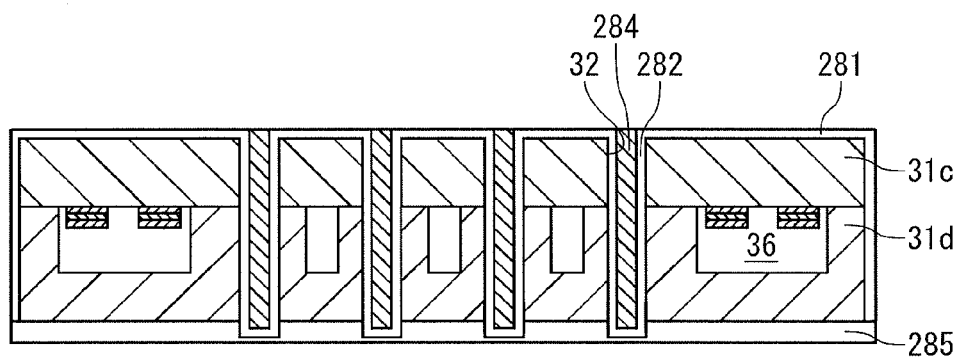

As shown in FIG. 13B, next, an insulating film 285 is formed to cover the lower surface of the substrate 31d. At this time, preferably, the insulating film 285 is formed so as to cover the insulating film 282 and metal layer 284 which protrude from the lower surface of the substrate 31d. The insulating film 285 is obtained by forming a silicon oxide film or a silicon nitride film on the lower surface of the substrate 31d by, for example, the CVD method. The insulating film 285 which covers the lower surface of the substrate 31d may be made of a resin (for example, an epoxy resin). The resin film is obtained by, for example, attaching a resin film or applying a liquid resin.

Then, the tip ends of the insulating film 282 and metal layer 284 which protrude from the lower surface of the substrate 31d are polished together with the insulating film 285 to expose the metal layer 284, to thereby obtain the through electrodes 33 shown in FIG. 5A. As this occurs, the insulating film 285 (see FIG. 13B) which is formed on the lower surface of the substrate 31d is thinned to remain on the lower surface of the substrate 31d. Alternatively, all of the insulating film 285 may be removed in the polishing of the tip ends of the insulating film 282 and the metal layer 284, and thereafter an insulating film which covers the lower surface of the substrate 31d may be again formed.

For example, glass, ceramics, or the like may be used as the material of the substrate body 31 of the intermediate substrate 30 shown in FIG. 1. Also, as shown in FIG. 2, the intermediate substrate 30 includes the first substrate 31c and the second substrate 31d. Glass, ceramics, or the like may be used as the material of one of the first substrate 31c and the second substrate 31d. In the case where glass is used as the substrate material, for example, the two substrates can be bonded together by a bonding method such as the anodic bonding.

The intermediate substrate may be mounted on a wiring substrate.

Figure 14:
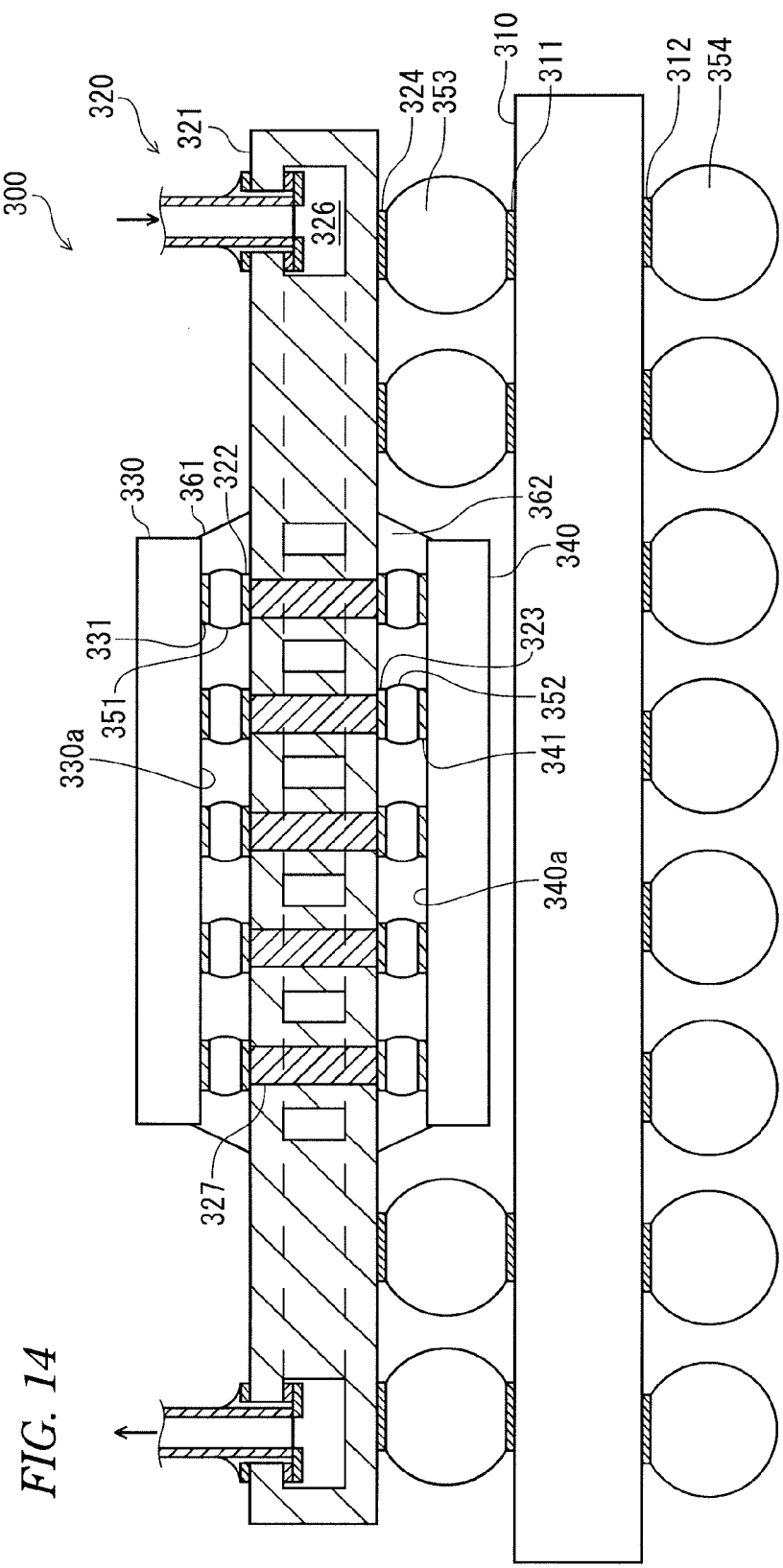
FIG. 14 is a schematic diagram of another semiconductor device.

As shown in FIG. 14, for example, a semiconductor device 300 includes a wiring substrate 310, an intermediate substrate 320, and a plurality of semiconductor chips 330, 340 (two semiconductor chips in FIG. 14). The semiconductor chip 330 is mounted on an upper surface of the intermediate substrate 320, and the semiconductor chip 340 is mounted on a lower surface of the intermediate substrate 320. The intermediate substrate 320 is mounted on an upper surface of the wiring substrate 310. The wiring substrate 310 is mounted on a mounting substrate (for example, a motherboard) which is not shown. Electrode pads 331 formed on a device surface 330a of the semiconductor chip 330 are connected through bumps 351 to electrode pads 322 which are formed on the upper surface of the substrate body 321 of the intermediate substrate 320. A gap between the semiconductor chip 330 and the intermediate substrate 320 (substrate body 321) is filled with an under-fill resin 361. Similarly, electrode pads 341 formed on a device surface 340a of the semiconductor chip 340 are connected through bumps 352 to electrode pads 323 which are formed on the lower surface of the substrate body 321. A gap between the semiconductor chip 340 and the intermediate substrate 320 (substrate body 321) is filled with an under-fill resin 362. A flow path 326 is formed in the substrate body 321 of the intermediate substrate 320. Therefore, the two semiconductor chips 320, 340 can be efficiently cooled by the intermediate substrate 320.

In the intermediate substrate 320, electrode pads 324 are formed on the lower surface of the substrate body 321, and the electrode pads 324 are connected through bumps 353 to electrode pads 311 which are formed on an upper surface of the wiring substrate 310. The intermediate substrate 320 has through electrodes 327 which penetrate through the substrate body 321 from the upper surface of the substrate body 321 to the lower surface of the substrate body 321. The through electrodes 327 connect the electrode pads 322 on the upper surface of the substrate body 321, to the electrode pads 323 on the lower surface of the substrate body 321, respectively. Although the through electrodes 327 are shown in FIG. 14, the intermediate substrate has wirings (not shown) which are formed so as to adequately connect the electrode pads 322, 323, 324. Also, although not shown in FIG. 14, an insulating film is formed on the surface of the substrate body 321 and the like. The wiring substrate 310 is mounted on the mounting substrate (for example, a motherboard) which is not shown, by electrode pads 312 and bumps 354 which are formed on the lower surface. Although not illustrated, the wiring substrate 310 has wirings for connecting the electrode pads 311 on the upper surface to the electrode pads 312 on the lower surface. Although FIG. 14 shows the semiconductor chips 330, 340 which are mounted on the upper and lower surfaces of the intermediate substrate 320, respectively, a plurality of semiconductor chips may be mounted on at least one of the upper and lower surfaces.

Figure 15:
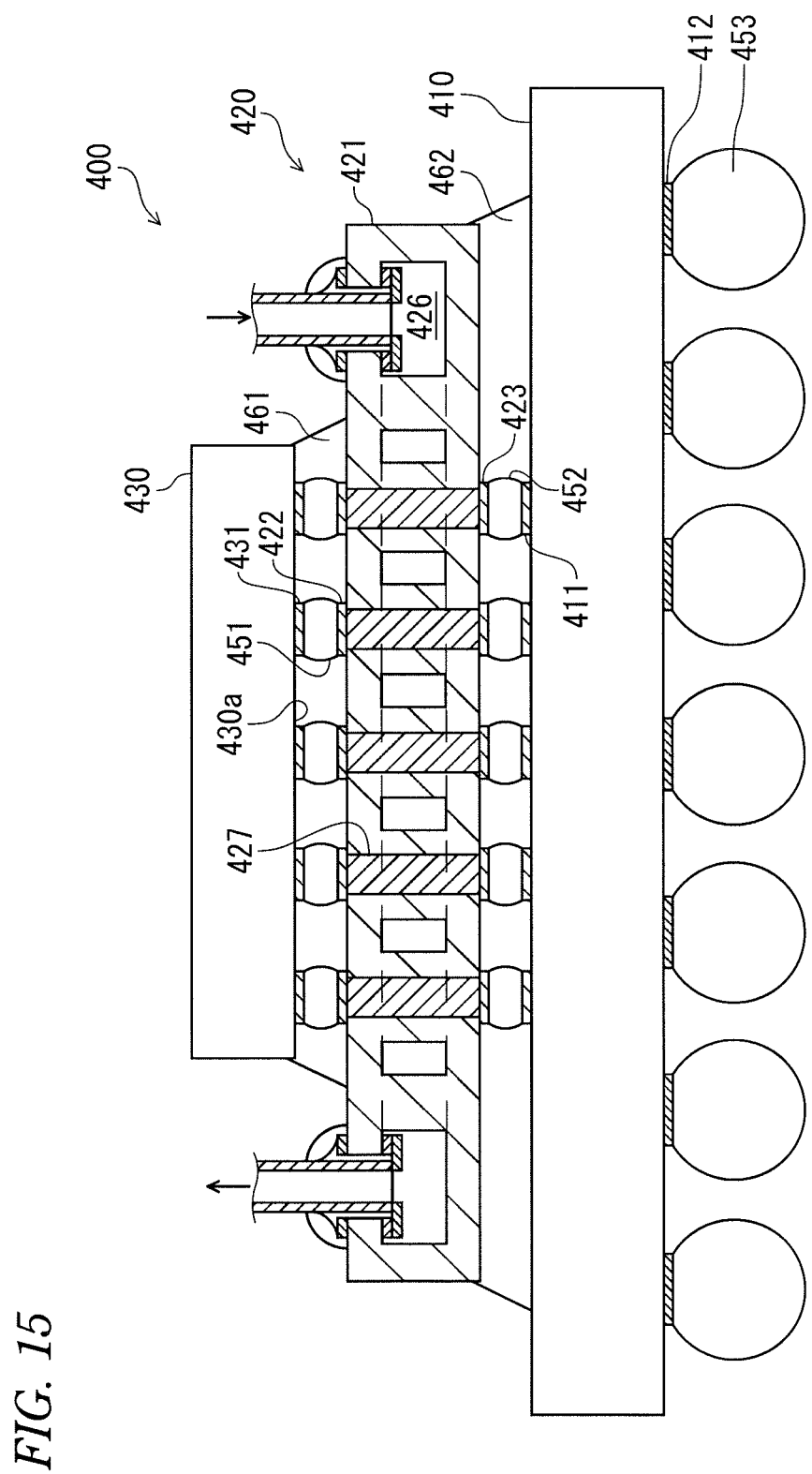
FIG. 15 is a schematic diagram of further another semiconductor device.

As shown in FIG. 15, a semiconductor device 400 has a wiring substrate 410, an intermediate substrate 420, and one semiconductor chip 430. The intermediate substrate 420 is mounted on an upper surface of the wiring substrate 410, and the semiconductor chip 430 is mounted on an upper surface of the intermediate substrate 420. The wiring substrate 410 is mounted on a mounting substrate (for example, a motherboard) which is not shown. Electrode pads 431 formed on a device surface 430a of the semiconductor chip 430 are connected through bumps 451 to electrode pads 422 which are formed on the upper surface of the substrate body 421 of the intermediate substrate 420. A gap between the semiconductor chip 430 and the intermediate substrate 420 (substrate body 421) is filled with an under-fill resin 461. A flow path 426 is formed in the substrate body 421 of the intermediate substrate 420. Therefore, the semiconductor chip 430 can be efficiently cooled by the intermediate substrate 420.

In the intermediate substrate 420, electrode pads 423 are formed on the lower surface of the substrate body 421, and the electrode pads 423 are connected through bumps 452 to electrode pads 411 which are formed on the upper surface of the wiring substrate 410. A gap between the intermediate substrate 420 (substrate body 421) and the wiring substrate 410 is filled with an under-fill resin 462. The intermediate substrate 420 includes through electrodes 427 which penetrate through the substrate body 421 from the upper surface of the substrate body 421 to the lower surface of the substrate body 421. The through electrodes 427 connect the electrode pads 422 on the upper surface of the substrate body 421, to the electrode pads 423 on the lower surface of the substrate body 421, respectively. Although not shown in FIG. 15, an insulating film is formed on the surface of the substrate body 421 and the like. The wiring substrate 410 is mounted on the mounting substrate (for example, a motherboard) which is not shown, by electrode pads 412 and bumps 453 which are formed on the lower surface. Although not illustrated, the wiring substrate 410 has wirings for connecting the electrode pads 411 on the upper surface to the electrode pads 412 on the lower surface. Although FIG. 15 shows the one semiconductor chip 430 which is mounted on the upper surface of the intermediate substrate 420, a plurality of semiconductor chips may be mounted.

CLAUSES

This disclosure further encompasses various exemplary embodiments, for example, described below.

1. A method for manufacturing an interposer formed with a flow path thereinside, through which a cooling medium flows, the method comprising:
forming metal layers on a first substrate;
forming first recess portions in a second substrate so as to have a shape corresponding to the flow path;
bonding the first and second substrates to each other so that the metal layers are located in the first recess portions; and
forming an inflow port and an outflow port in the first substrate so as to extend from a surface of the first substrate to the metal layers, wherein
the interposer is configured to be mounted with an electronic component.

2. The method according to the clause 1, further comprising:
forming second recess portions in the first substrate so as to have a shape corresponding to the flow path.

3. The method according to the clause 2, wherein the metal layers are formed on bottom surfaces of the second recess portions formed in the first substrate.

4. The method according to the clause 1, wherein
the forming of the metal layers includes forming first openings in the metal layers,
the method further comprising:
etching parts of the metal layers to form second openings in the metal layers so that
the second openings are larger in section area than the first openings, and
the section areas of the second openings are substantially equal to those of the inflow and outflow ports.

5. The method according to the clause 1, further comprising:
inserting first and second pipes into the inflow and outflow ports, respectively, so that the first and second pipes abut against the metal layers.

The exemplary embodiments have been described above in detail. It should be noted that the invention is not limited thereto. Various modifications and changes may be made within the scope of the spirit of the invention set forth in claims.

What is claimed is:

1. An interposer for cooling an electronic component, the interposer comprising:
a substrate body configured to be mounted with the electronic component, the substrate body being formed with
a flow path thereinside, through which a cooling medium flows,
an inflow port formed in the substrate body to extend from an inner surface of the flow path to a surface of the substrate body, through which the cooling medium flows into the flow path, and
an outflow port formed in the substrate body to extend from the inner surface of the flow path to the surface of the substrate body, through which the cooling medium flows out of the flow path;
a first member that is formed on the inner surface of the flow path and that includes
a first abutment member defining a first opening, wherein the first opening is smaller in section area than the inflow port, and
a first connection member that connects is provided between the first abutment member and the inner surface of the flow path to connect the first abutment member to the inner surface of the substrate body and that defines a second opening, wherein a section area of the second opening is substantially equal to that of the inflow port; and a second member that is formed on the inner surface of the flow path and that includes
  a second abutment member defining a third opening, wherein the third opening is smaller in section area than the outflow port, and
  a second connection member that connects is provided between the second abutment member and the inner surface of the flow path to connect the second abutment member to the inner surface of the flow path and that defines a fourth opening, wherein a section area of the fourth opening is substantially equal to that of the outflow port.

2. The interposer according to claim 1, wherein the first and second abutment members are formed in an annular shape.

3. The interposer according to claim 1, wherein
the substrate body includes
  a first surface configured to be mounted with the electronic component, and
  a second surface that is an opposite surface to the first surface, and
the interposer further comprising:
  a plurality of through electrodes that pass through the substrate body from the first surface to the second surface and that are configured to be electrically connected to terminals of the electronic component.

4. The interposer according to claim 1, wherein
the first abutment member includes a first Cu layer,
the first connection member includes
  a first Ti layer formed on the inner surface of the flow path, and
  a first Ni layer on which the first Cu layer of the first abutment member is formed,
the second abutment member includes a second Cu layer, and
the second connection member includes
  a second Ti layer formed on the inner surface of the flow path, and
  a second Ni layer on which the second Cu layer of the second abutment member is formed.

5. A semiconductor device comprising:
the interposer according to claim 1; and
the electronic component mounted on the interposer.

6. An interposer for cooling an electronic component, the interposer comprising:
  a substrate body configured to be mounted with the electronic component, the substrate body being formed with
    a flow path thereinside, through which a cooling medium flows,
    an inflow port formed in the substrate body to extend from an inner surface of the flow path to a surface of the substrate body, through which the cooling medium flows into the flow path, and
    an outflow port formed in the substrate body to extend from the inner surface of the flow path to the surface of the substrate body, through which the cooling medium flows out of the flow path;
  a first member that is formed on the inner surface of the flow path and that includes
    a first abutment member defining a first opening, wherein the first opening is smaller in section area than the inflow port, and
    a first connection member that is provided between the first abutment member and the inner surface of the flow path substrate body to connect the first abutment member to the inner surface of the flow path and that defines a second opening, wherein a section area of the second opening is substantially equal to that of the inflow port;
  a second member that is formed on the inner surface of the flow path and that includes
    a second abutment member defining a third opening, wherein the third opening is smaller in section area than the outflow port, and
    a second connection member that is provided between the second abutment member and the inner surface of the flow path to connect the second abutment member to the inner surface of the flow path and that defines a fourth opening, wherein a section area of the fourth opening is substantially equal to that of the outflow port:
  a first pipe including a first end portion, wherein
    the first pipe is inserted into the inflow port so that the first end portion of the first pipe abuts against the first member, and
    the first pipe protrudes from a first surface of the substrate body:
  a first solder portion that extends from the first pipe to the first member and connects the first pipe to the first member;
  a second pipe including a second end portion, wherein
    the second pipe is inserted into the outflow pipe port so that the second end portion of the second pipe abuts against the second member, and
    the second pipe protrudes from the first surface of the substrate body; and
  a second solder portion that extends from the second pipe to the second member and connects the second pipe to the second member.

7. The interposer according to claim 6, further comprising:
  a first resin portion that covers the first solder portion; and
  a second resin portion that covers the second solder portion.

8. The interposer according to claim 6, wherein
the first end portion of the first pipe abuts against the first abutment member, and
the second end portion of the second pipe abuts against the second abutment member.

9. The interposer according to claim 8, wherein
the first abutment member includes a first Cu layer,
the first connection member includes
  a first Ti layer formed on the inner surface of the flow path, and
  a first Ni layer on which the first Cu layer of the first abutment member is formed,
the second abutment member includes a second Cu layer, and
the second connection member includes
  a second Ti layer formed on the inner surface of the flow path, and
  a second Ni layer on which the second Cu layer of the second abutment member is formed.

10. The interposer according to claim 6, wherein
the first surface of the substrate body is configured to be mounted with the electronic component, and
the substrate body further includes a second surface that is an opposite surface to the first surface,
the interposer further comprising:
  a plurality of through electrodes that pass through the substrate body from the first surface to the second surface and that are configured to be electrically connected to terminals of the electronic component.

11. The interposer according to claim 6, further comprising:
- a first connection pad formed on the first surface of the substrate body in a periphery of the inflow port; and
- a second connection pad formed on the first surface of the substrate body in a periphery of the outflow port, wherein
- the first pipe further includes a first flange portion,
- the second pipe further includes a second flange portion,
- the first solder portion connects the first flange portion to the first connection pad, and
- the second solder portion connects the second flange portion to the second connection pad.

12. A semiconductor device comprising:
- the interposer according to claim 6; and
- the electronic component mounted on the interposer.

* * * * *